(12) United States Patent
Li et al.

(10) Patent No.: US 9,963,297 B2
(45) Date of Patent: May 8, 2018

(54) POSITIONING FOOT, POSITIONING DEVICE AND POSITION CORRECTION METHOD

(71) Applicants: Boe Technology Group Co., Ltd., Beijing (CN); Hefei Xinsheng Optoelectronics Technology Co., Ltd., Anhui (CN)

(72) Inventors: Yunze Li, Beijing (CN); Sheng Tao, Beijing (CN); Dai Dong, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days. days.

(21) Appl. No.: 15/107,581

(22) PCT Filed: Jan. 21, 2016

(86) PCT No.: PCT/CN2016/071591
§ 371 (c)(1),
(2) Date: Jun. 23, 2016

(87) PCT Pub. No.: WO2017/012319
PCT Pub. Date: Jan. 26, 2017

(65) Prior Publication Data
US 2017/0210568 A1 Jul. 27, 2017

(30) Foreign Application Priority Data
Jul. 21, 2015 (CN) .......................... 2015 1 0429280

(51) Int. Cl.
*B65G 47/26* (2006.01)
*B65G 21/10* (2006.01)
(Continued)

(52) U.S. Cl.
CPC ............. *B65G 21/10* (2013.01); *B65G 13/12* (2013.01); *B65G 47/82* (2013.01)

(58) Field of Classification Search
CPC ................ B65G 47/82; B65G 2207/42; B65G 2203/0225; B65H 2404/14; G03B 27/42; G03B 27/58
(Continued)

(56) References Cited

U.S. PATENT DOCUMENTS

| | | | | |
|---|---|---|---|---|
| 4,907,632 A | * | 3/1990 | Reuter | ...................... B27C 5/08 144/246.1 |
| 5,292,223 A | * | 3/1994 | Meschi | .................. B65H 31/34 414/788 |

(Continued)

FOREIGN PATENT DOCUMENTS

| | | |
|---|---|---|
| CN | 1536640 | 10/2004 |
| CN | 1733577 | 2/2006 |

(Continued)

OTHER PUBLICATIONS

International Search Report and Written Opinion from PCT/CN16/071591 dated Apr. 28, 2016.
(Continued)

*Primary Examiner* — James R Bidwell
(74) *Attorney, Agent, or Firm* — Calfee, Halter & Griswold LLP

(57) ABSTRACT

The present disclosure provides a positioning foot, a positioning device and a method for correcting position of a glass substrate, and belongs to the technical field of automatic positioning. The positioning foot of the present disclosure comprises: a contact member for contacting a side of the glass substrate; an elastic member, a first end of which is connected with the contact member and receives a counterforce from the glass substrate delivered by the contact (Continued)

member so as to compress the elastic member, and a second end of which is fixed; and a sensor fixed on the second end of the elastic member. Wherein, the contact member is arranged to be displaced with a compression action of the elastic member, and after the contact member is displaced to a predetermined position, the sensor is triggered to be in an "ON" state such that the elastic member stops the compression action.

18 Claims, 4 Drawing Sheets

(51) Int. Cl.
  *B65G 13/12* (2006.01)
  *B65G 47/82* (2006.01)
(58) Field of Classification Search
  USPC .............................. 198/457.07, 624
  See application file for complete search history.

(56) References Cited

U.S. PATENT DOCUMENTS

| | | | | |
|---|---|---|---|---|
| 5,471,279 A | * | 11/1995 | Takizawa | G03F 7/70691 269/21 |
| 5,730,279 A | * | 3/1998 | Judge | B65G 35/00 198/621.1 |
| 6,231,299 B1 | * | 5/2001 | Newsome | B65G 21/2054 198/624 |
| 6,848,565 B2 | * | 2/2005 | Lehmann | B65G 47/22 198/416 |
| 9,082,799 B2 | * | 7/2015 | Weaver | C23C 14/042 |
| 2014/0102852 A1 | | 4/2014 | Wang et al. | |

FOREIGN PATENT DOCUMENTS

| | | |
|---|---|---|
| CN | 201961833 U | 9/2011 |
| CN | 102897535 A | 1/2013 |
| CN | 104992919 | 10/2015 |
| JP | H05109871 A | 4/1993 |
| JP | 2003188076 A | 7/2003 |

OTHER PUBLICATIONS

First Office Action for Chinese Patent Application No. 201510429280.2 dated May 22, 2017.
Second Office Action for Chinese Patent Application No. 201510429280.2 dated Jul. 24, 2017.

* cited by examiner

POSITIONING FOOT, POSITIONING DEVICE AND POSITION CORRECTION METHOD

RELATED APPLICATIONS

The present application is the U.S. national phase entry of PCT/CN2016/071591, with an international filing date of Jan. 21, 2016, which claims the benefit to Chinese Patent Application No. 201510429280.2, filed on Jul. 21, 2015, the entire disclosures of which are incorporated herein by reference.

TECHNICAL FIELD

Embodiments of the present disclosure relate to automatic position correction of glass substrates, and in particular to a positioning foot adapted for position correction of glass substrates of difference sizes, a positioning device and a position correction method thereof.

BACKGROUND

A glass substrate is a basic component for various display devices. For example, the use of glass substrates cannot be avoided in multifarious display panels, and the glass substrates have to undergo various processes and treatments during the manufacture of the display panels, wherein one important process step is correcting the glass substrates one by one to a certain position (e.g., positioning them in a centerline) so as to prepare them for a next production procedure, and this is namely a position correction process during the taping-out of the glass substrates.

In a known position correction process, a simple roller is used as a positioning foot that directly acts on a glass substrate mechanically, and a positioning system positions the glass substrate on which the roller acts by accurately controlling displacement of the roller, thereby achieving mechanical correction.

However, in order to manufacture display panels of different types, the glass substrates are often not single-sized. In a production line with high degree of automation, in order to achieve automatic position correction of the glass substrate, for the position correction of glass substrates of different sizes, it is necessary to establish different displacement recipes for controlling the actions of the positioning foot so as to accurately control a corresponding movement of the positioning foot. Therefore, when the size of the glass substrate changes, a corresponding displacement recipe for controlling the roller has to be manually switched by an operator, which is complicated and can easily give rise to switching errors, and as a result, the movement of the positioning foot does not conform to the positioning of the glass substrate of a corresponding size. Meanwhile, glass substrates are relatively fragile, and in case of an operational error of the operator or an unreasonable displacement recipe, the glass substrates are apt to be cracked, which will greatly reduce the product yield.

Therefore, the known mechanical correction technique for glass substrates at least has the following defects: (1) the process of establishing a displacement recipe for glass substrates of different sizes is complicated and dependent on manual switching operations with a lower degree of automation when positioning correction of glass substrates of different sizes; (2) the glass substrates can be easily cracked during position correction, which is harmful to the improvement of product yield.

SUMMARY

One of the objects of at least one embodiment of the present disclosure is to propose a positioning foot and a positioning device for correcting positions of glass substrates of different sizes.

Another object of the at least one embodiment of the present disclosure is to reduce cracking of the glass substrates during position correction.

Yet another goal of the at least one embodiment of the present disclosure is to improve the degree of automation in position correction operation of the glass substrates.

According to one aspect of the present disclosure, a positioning foot for correcting position of a glass substrate is provided, comprising:

a contact member for contacting a side of the glass substrate;

an elastic member, a first end of which is connected with the contact member and receives a counterforce from the glass substrate delivered by the contact member so as to compress the elastic member, and a second end of which is fixed; and a sensor fixed on the second end of the elastic member;

wherein, the contact member is arranged to be displaced with a compression action of the elastic member, and after the contact member is displaced to a predetermined position, the sensor is triggered to be in an "ON" state such that the elastic member stops the compression action.

In the positioning foot, the elastic member comprises a spring capable of being restored to its initial length after the compression action.

In the positioning foot according to one embodiment, the sensor is a photoelectric sensor, and the positioning foot is further provided with a shutter to be displaced in synchronization with the contact member, the shutter being configured to trigger the sensor to be in an "ON" state when the contact member is displaced to the predetermined position.

In the positioning foot according to one embodiment, the contact member comprises:

a roller;

a pushing portion in fixed connection with the roller, the first end of the elastic member being connected with the pushing portion; and the shutter fixed on the pushing portion and arranged to protrude towards the sensor.

In the positioning foot according to one embodiment, the photoelectric sensor comprises an emitting portion and a receiving portion, the shutter blocking signals sent by the emitting portion when it is displaced to the predetermined position.

In the positioning foot according to one embodiment, the shutter is arranged to have a length in a displacement direction which is just sufficient for enabling the contact member to trigger the sensor to be in an "ON" state when the contact member is displaced to the predetermined position.

In the positioning foot according to another embodiment, the sensor is a pressure sensor that receives an acting force from the elastic member generated at the second end thereof in the compression action.

In the positioning foot according to one embodiment, the contact member comprises:

a roller, and a pushing portion in fixed connection with the roller;

wherein the first end of the elastic member is connected with the pushing portion.

In the positioning foot according to any one of the preceding embodiments, the positioning foot is further provided with a slide rail on which the elastic member and the contact member are arranged, the contact member being displaceable in a sliding manner with the compression action of the elastic member.

According to another aspect of the present disclosure, a positioning device for correcting position of a glass substrate is provided, comprising:

a first positioning lever on which one or more of any positioning feet as mentioned above are fixed; and a second positioning lever on which one or more of any positioning feet as mentioned above are fixed;

wherein contact members of the positioning feet of the first positioning lever face a first side of the glass substrate, and contact members of the positioning feet of the second positioning lever face a second side of the glass substrate opposite to the first side.

In the positioning device according to one embodiment of the present disclosure, the positioning device further comprises:

a control member for controlling both the first positioning lever and the second positioning lever to conduct an approach movement towards the glass substrate until the sensors of the positioning feet of both the first positioning lever and the second positioning lever are triggered to be in an "ON" state and then stopping the approach movement of both the first positioning lever and the second positioning lever.

In the positioning device according to another embodiment of the present disclosure, one of the first positioning lever and the second positioning lever is fixed;

wherein the positioning device further comprises:

a control member for controlling the other positioning lever to conduct an approach movement towards the glass substrate until the sensors of the positioning feet of both the first positioning lever and the second positioning lever are triggered to be in an "ON" state and then stopping the approach movement of the other positioning lever.

In the positioning device according to any one of the preceding embodiments, the control member comprises a motor and a control unit for driving the first positioning lever and/or the second positioning lever to move;

wherein, when triggered to be in an "ON" state, the sensor feeds back a signal to the control unit such that the motor stops driving the approach movement of the corresponding first positioning lever and/or second positioning lever.

In the positioning device according to any one of the preceding embodiments, the first positioning lever and the second positioning lever are arranged to be parallel with a positioning line, wherein the positioning line is positioned in a position where a central line of the glass substrate shall be located after position correction.

In the positioning device according to any one of the preceding embodiments, a plurality of said positioning feet are arranged at equal intervals in perpendicular to the first positioning lever/the second positioning lever.

According to yet another aspect of the present disclosure, a method for correcting position of a glass substrate based on any positioning device mentioned above, comprising:

placing the glass substrate between the first positioning lever and the second positioning lever;

conducting an approach movement of the first positioning lever and the second positioning lever towards each other such that the first positioning lever and the second positioning lever sequentially or simultaneously correspondingly contact the first side and the second side of the glass substrate respectively;

when the sensors of the positioning feet of the first positioning lever and the second positioning lever are all triggered to be in an "ON" state, which indicates that the position of the glass substrate has been corrected, stopping the approach movement.

In the position correction method, when the sensors of the positioning feet of the first positioning lever and the second positioning lever are all triggered to be in an "ON" state, the sensors send a feedback signal that enables stopping the approach movement.

In the position correction method, after position correction of the glass substrate is accomplished, the second positioning lever/both the first positioning lever and the second positioning lever are driven back to an initial position.

In one embodiment, during the approach movement of the first positioning lever and the second positioning lever towards each other, one of the first positioning lever and the second positioning lever is fixed, and the other is movable.

In another embodiment, during the approach movement of the first positioning lever and the second positioning lever towards each other, both the first positioning lever and the second positioning lever conduct an approach movement towards the glass substrate.

When the positioning device comprising several positioning feet provided in the embodiments of the present disclosure corrects position of a glass substrate, no matter how the size of the glass substrate varies, its position can be corrected substantially without manual switching operation of the displacement recipes with respect to glass substrates of different sizes. The process procedure of position correction is greatly simplified, the degree of automation is improved and the workload of the operator is reduced; and there is no problem of manual switching operation errors, the risks in cracking the glass substrates is small and it helps to improve the product yield.

BRIEF DESCRIPTION OF DRAWINGS

From the following detailed explanations with reference to the drawings, the above and other objects and advantages of the present disclosure will be rendered more complete and much clearer, wherein same or similar elements are represented by same signs.

DETAILED DESCRIPTION OF EMBODIMENTS

Figure 1:
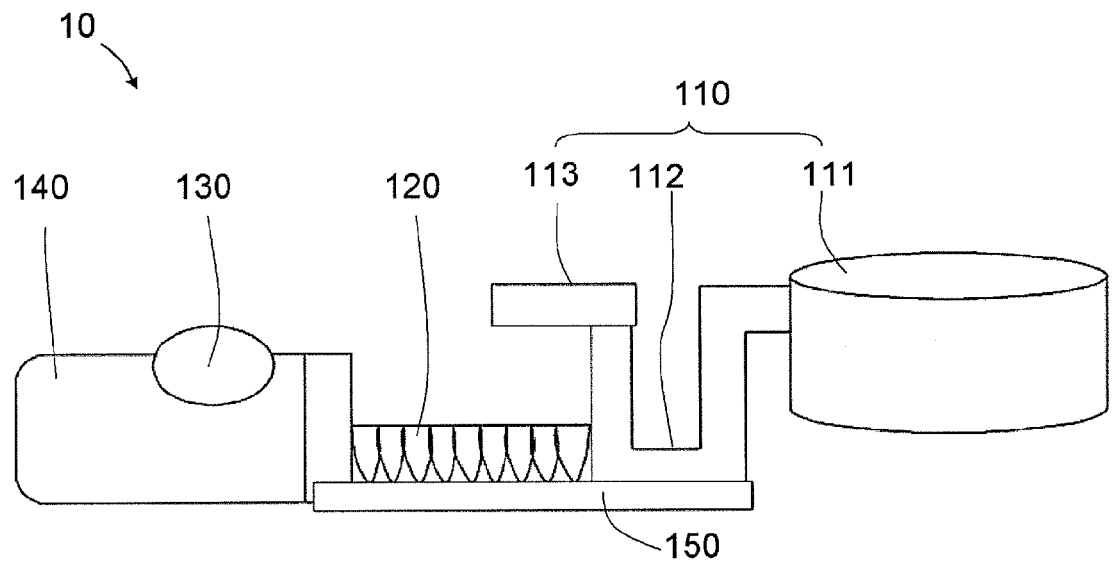
FIG. 1 is a schematic structural view of a positioning foot according to one embodiment.

Some of a plurality of possible embodiments of the present disclosure will be introduced below, which aim to provide a basic understanding of the present disclosure, instead of identifying the key or critical elements of the disclosure or defining the protection scopes of the present disclosure.

In the following description, for the sake of clarity and conciseness of the description, detailed descriptions are not provided for all components shown in the drawings. Multiple components for enabling one having ordinary skills in the art to completely carry out the present disclosure are shown in the drawings, and for those skilled in the art, operations of many components are familiar and obvious.

Figure 2:
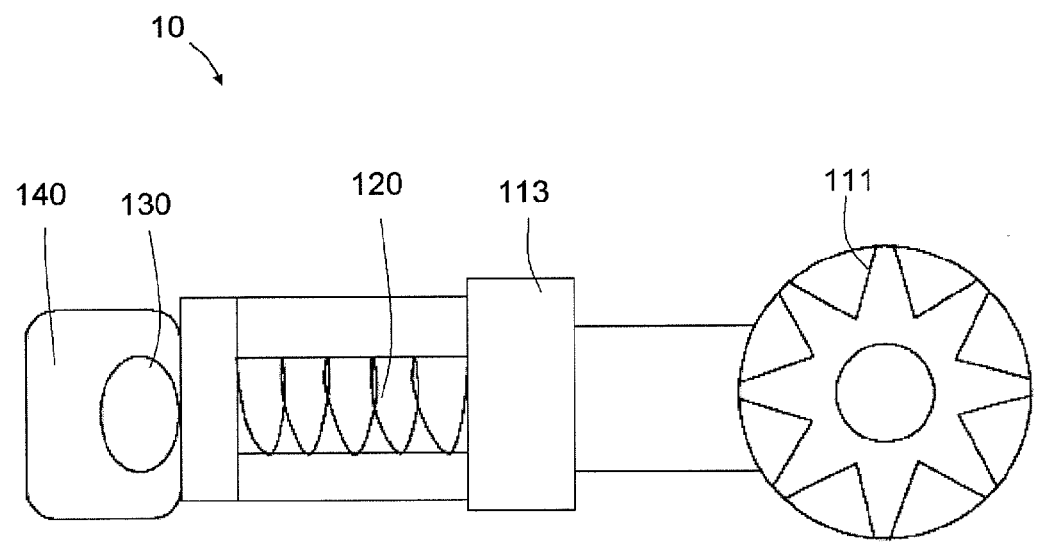
FIG. 2 is a top view of a positioning foot according to one embodiment.
Figure 3:
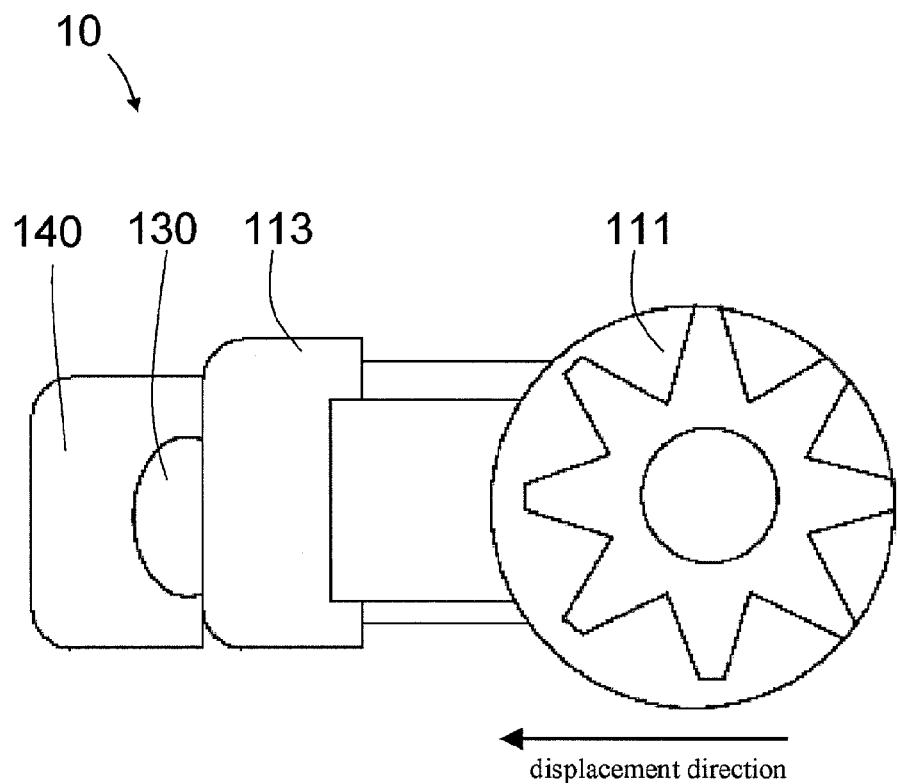
FIG. 3 is a schematic view of the positioning foot in FIG. 2 when its sensor is triggered to be in an "ON" state.

FIG. 1 is a schematic structural view of a positioning foot according to one embodiment of the present disclosure; FIG. 2 is a top view of a positioning foot according to one embodiment of the present disclosure; FIG. 3 is a schematic view of the positioning foot in FIG. 2 when its sensor is triggered to be in an "ON" state. The positioning foot 10 of the embodiment of the present disclosure will be described below in detail with reference to FIGS. 1-3.

Referring to FIGS. 1-3, the positioning foot 10 mainly comprises a contact member 110, an elastic member 120 and a sensor 130, wherein the contact member 110 is used for contacting, during positioning a glass substrate, an edge of the glass substrate, i.e., contacting a side of the glass substrate, such that it can apply an acting force on the glass substrate to push the glass substrate to move and return, and meanwhile the contact member 110 also receives a counterforce from the glass substrate.

The elastic member 120 is arranged between the contact member 110 and the sensor 130 and can be elastically compressed therebetween; its second end is relatively fixed, and its first end (the end opposite to the second end) is connected with the contact member 110 such that it can receive the counterforce from the glass substrate delivered by the contact member 110 so as to compress the elastic member 120. When compressed and deformed, the first end of the elastic member 120 connected with the contact member 110 can actuate the contact member 110 to move together, i.e., the contact member 110 is arranged to be displaced with a compression action of the elastic member.

In the positioning foot 10 of the embodiment of the present disclosure, displacement of the contact member 110 reflects position correction situation of the glass substrate, and the contact member 110 can feed back its displacement situation to the sensor 130. In this embodiment, the sensor 130 is fixed on a fixation fitting portion 140 of the positioning foot 10 and is immobilized relative to the second end of the elastic member 120. The sensor 130 can be a photoelectric sensor, and specifically the photoelectric sensor comprises an emitting portion and a receiving portion, wherein it is triggered to be in an "ON" state when the receiving portion does not receive any light signals sent by the emitting portion, and otherwise it remains in an "OFF" state.

When the positioning foot 10 in the above embodiment is applied for position correction of a glass substrate 90, the positioning of the position correction of the glass substrate is accurate, and the requirement of movement accuracy of the positioning foot is lowered; besides, the positioning foot and the glass substrate do not contact each other mechanically rigidly, which decreases the risks in cracking the glass substrate and helps to improve the product yield.

Specifically, when the corresponding sensor 130 is a photoelectric sensor, in the embodiment as shown in FIG. 1, the contact member 110 is arranged to comprise a roller 111, a pushing portion 112 and a shutter 113. Therein the roller 111 directly acts on an edge of the glass substrate; in this example the pushing portion 112 is constructed as having a groove structure and connected with the first end of the elastic member 110, and it can push the elastic member 120 to produce an elastic deformation during position correction; the shutter 113 is fixed on the pushing portion 112 and arranged to protrude towards the sensor 130. Thus after the elastic member 120 produces a predetermined amount of compression deformation, the contact member 110 will also be correspondingly displaced to a predetermined position which has been designed. In this predetermined position (as shown in FIG. 3), the shutter 113 can be interpolated between the emitting portion and the receiving portion of the photoelectric sensor for blocking light signals sent by the emitting portion of the photoelectric sensor such that the receiving portion of the photoelectric sensor cannot receive the light signals, and as a result, the photoelectric sensor is triggered from an "OFF" state to an "ON" state.

Specifically, the elastic member 120 can specifically be but not limited to a spring which can be compressed under the counterforce from the glass substrate, and restored to its initial length after the compression action, i.e., the spring produces an elastic deformation during position correction of the glass substrate. During specific operation, the spring converts power of the glass substrate reacted on the contact member 110 into elastic potential energy of the spring, which is specifically calculated through the following relational expression (1):

$$\int_x^0 -kx\,dx = \frac{1}{2}kx^2 \qquad (1)$$

wherein, k is an elastic coefficient of the spring, x is a compression deformation amount of the spring, i.e., a displacement distance of the first end of the spring. The specific elastic coefficient k of the spring can be chosen according to a weight range of the glass substrate and so on.

It should be understood that other components having a similar elastic deformation function with the spring can also be used as the elastic member of the positioning foot 10 of the present disclosure.

In one embodiment, length of the shutter 113 in a displacement direction can be calibrated so as to be just sufficient for enabling triggering the photoelectric sensor 130 to be in an "ON" state when the contact member 110 is displaced to the predetermined position, thereby ensuring accuracy of state conversion of the photoelectric sensor 130 and thus ensuring accuracy of position correction of the glass substrate. For calibration of the length of the shutter 113, factors such as the elastic coefficient k of the spring, a distance of the photoelectric sensor relative to the shutter 113, and a point where the predetermined position of the displacement is arranged should be taken into consideration.

Continuing with FIG. 1, the positioning foot 10 is further provided with a slide rail 150 on which the elastic member 120 and the contact member 110 are arranged, the contact member 110 being displaceable in a sliding manner with the compression action of the elastic member 120. Specifically, the pushing portion 112 of the contact member 110 is arranged on the slide rail 150 and the pushing portion 112 can be displaced reciprocally along the slide rail under the acting force of the spring.

Figure 4:
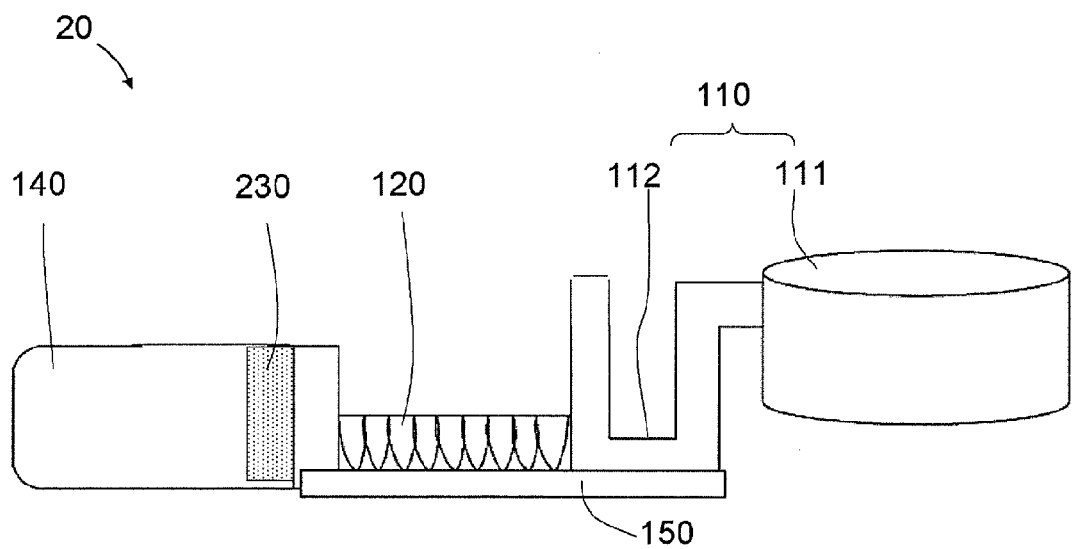
FIG. 4 is a schematic structural view of a positioning foot according to another embodiment.

FIG. 4 is a schematic structural view of a positioning foot according to another embodiment of the present disclosure. As compared with the positioning foot 10 of the embodiment as shown in FIG. 1, the positioning foot 20 of this embodiment mainly differs in that it uses a pressure sensor 230 which is fixed on the second end of the elastic member 120 and receives an acting force from the elastic member 120 generated at the second end thereof in the compression action, and when the acting force reaches a predetermined value, the pressure sensor is triggered from an "OFF" state to an "ON" state. By taking the case where the elastic member 120 is a spring as an example, as can be known from the above expression (1), the acting force generated by the second end of the spring in the compression action and the corresponding compression deformation amount x of the spring can be derived from calculation, so the spring is calibrated such that when the spring correspondingly produces a predetermined compression deformation amount $x_0$, i.e., when the contact member 110 is displaced to the predetermined position, the acting force generated at the second end thereof is just sufficient for triggering the pressure sensor from an "OFF" state to an "ON" state.

Continuing with FIG. 4, when the sensor 130 is a pressure sensor, the shutter 113 can be correspondingly omitted in the contact member 110, i.e., the contact member 110 only comprises the roller 111 and the pushing portion 112 as shown in FIG. 4. The respective same components of the positioning foot 20 and the positioning foot 10 will not be described herein one by one for simplicity.

Figure 5:
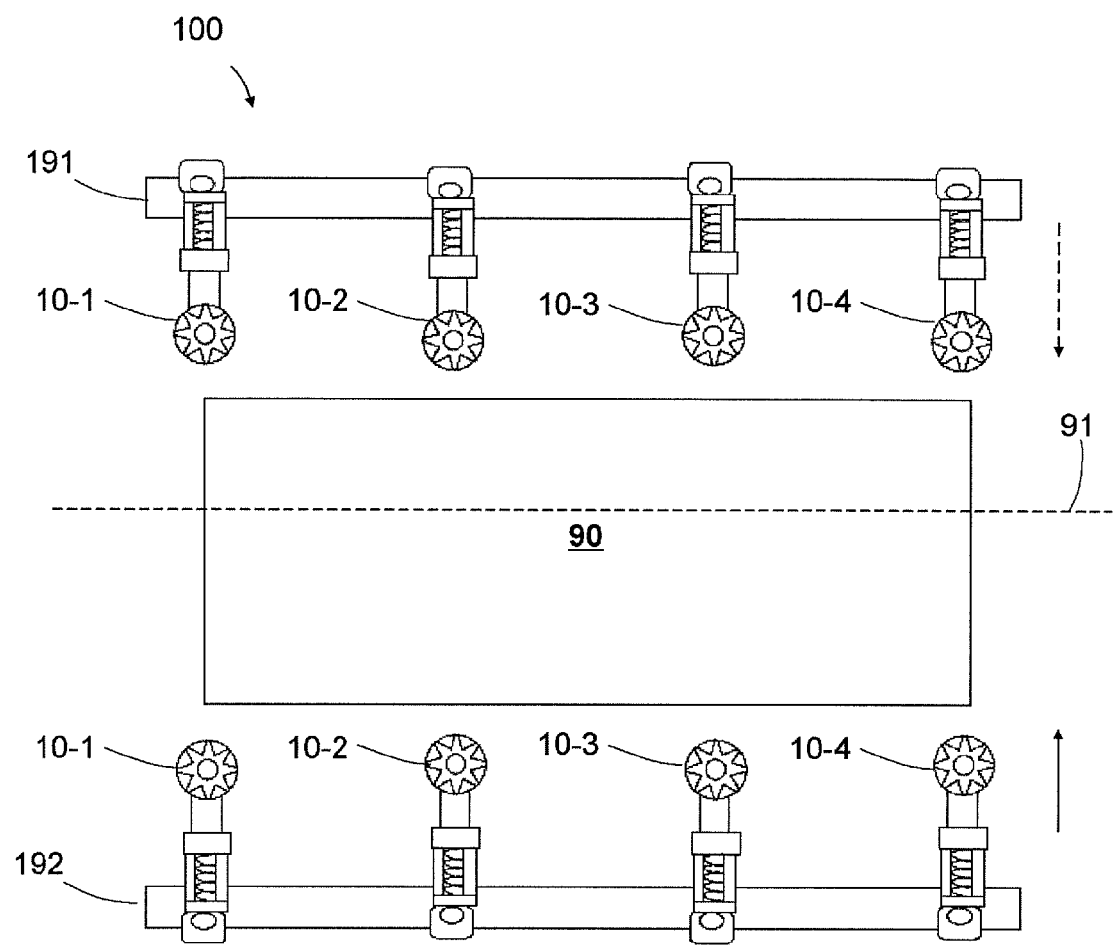
FIG. 5 is a schematic structural view of a positioning device according to one embodiment.

FIG. 5 is a schematic structural view of a positioning device according to one embodiment of the present disclosure. In this embodiment, explanations are given by taking the case where the positioning device 100 adopts the positioning foot 10 of the embodiment shown in FIG. 1 as an example, and it should be understood that with the teaching of the embodiment of the present disclosure, the positioning device of the present disclosure can also adopt positioning feet of other embodiments, e.g., the positioning foot 20.

The positioning device 100 comprises a positioning lever 191 and a positioning lever 192 which are arranged in parallel substantially. In this embodiment, the positioning lever 191 and the positioning lever 192 can be arranged to be parallel with a positioning line 91, wherein the positioning line 91 corresponds to a position where a central line of the glass substrate 90 shall be located after ideal position correction of the glass substrate 90. On each positioning lever, one or more same positioning feet 10 as shown in FIGS. 1-3 are arranged fixedly, each of which is fixed on the positioning lever through the fixation fitting portion 140, and is fixed substantially in perpendicular to the positioning levers. The number of the positioning feet 10 fitted and fixed on the positioning lever 191 and the positioning lever 192 is not limited, and it can be set according to specific situations. The number of the positioning feet 10 on the positioning lever 191 and the number of the positioning feet on the positioning lever 192 can be either the same or different. In the embodiment as shown in FIG. 5, both the positioning lever 191 and the positioning lever 192 are provided with four positioning feet: 10-1, 10-2, 10-3 and 10-4; preferably, the positioning feet 10-1, 10-2, 10-3 and 10-4 on the positioning lever 191 are respectively aligned with the positioning feet 10-1, 10-2, 10-3 and 10-4 on the positioning lever 192; more preferably, the positioning feet 10-1, 10-2, 10-3 and 10-4 are arranged at equal intervals on the positioning lever 191 or 192.

When the positioning device 100 of the present disclosure comprising several positioning feet 10 is used for correcting position of a glass substrate, no matter how the size of the glass substrate varies, its position can be corrected substantially without manual switching operation of the displacement recipes with respect to glass substrates of different sizes. The process procedure of position correction is greatly simplified, the degree of automation is improved and the workload of the operator is reduced due to simplicity in use; and there is no problem of manual switching operation errors; besides, by virtue of the arrangement of the elastic member and the sensor in the positioning foot, little damage will be done to the positioning device during positioning, which decreases the probability of multifunction of the positioning device and makes it relatively easier to ensure normal operation of the device.

Continuing with FIG. 5, the glass substrate 90 which requires position correction is arranged between the positioning lever 191 and the positioning lever 192, contact members 110 of each positioning foot 10 on the positioning lever 191 and the positioning lever 192 are arranged to face a side of the glass substrate 90 such that they can contact edges on both sides of the glass substrate 90 during position correction; wherein the positioning feet 10-1, 10-2, 10-3 and 10-4 of the positioning lever 191 can contact an edge on one side of the glass substrate 90, and the positioning feet 10-1, 10-2, 10-3 and 10-4 of the positioning lever 192 can contact an edge on the other side of the glass substrate 90.

The positioning device 100 is further provided with a control member (not shown in the figure), the control member comprising a motor (not shown in the figure) and a control unit for driving the positioning lever 191 and/or the positioning lever 192 to move. The motor can be for example a step motor and it can drive the positioning levers to conduct an approach movement towards the glass substrate 90 during position correction; the action of the approach movement can controlled by the control member. The control unit is coupled to each positioning foot 10 which can feed back signals to the control unit and the control unit can specifically transmit control signals to the motor, thereby achieving the approach movement of the positioning lever 191 and/or 192 towards the glass substrate 90.

In one embodiment, both the positioning lever 191 and the positioning lever 192 are driven to conduct an approach movement (in a movement direction as shown in the drawing) towards the glass substrate 90 until sensors of the positioning feet 10 of the positioning lever 191 and the positioning lever 192 are all triggered to be in an "ON" state and then the approach movement of the positioning lever 191 and the positioning lever 192 is stopped. In this embodiment, the positioning lever 191 and the positioning lever 192 can be arranged at an equal distance relative to the positioning line 91.

Preferably, the positioning lever 191 and the positioning lever 192 conduct an approach movement towards the glass substrate 90 at an equal velocity.

Figure 6:
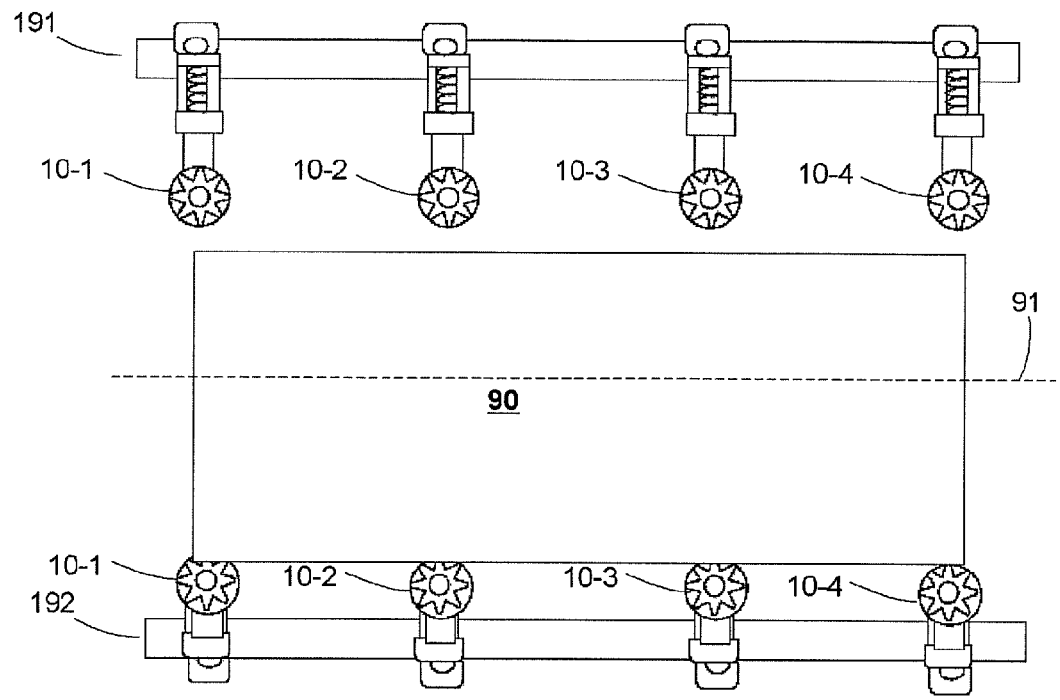
FIG. 6 is a schematic view of the positioning device of the embodiment as shown in FIG. 5 during position correction of a glass substrate.
Figure 7:
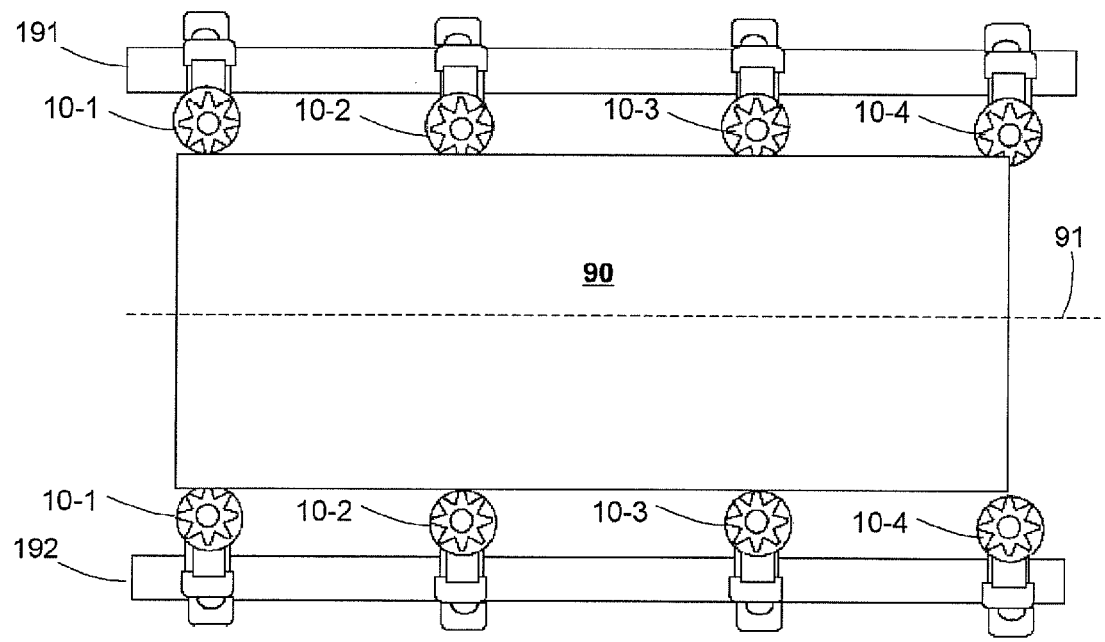
FIG. 7 is a schematic view of the positioning device of the embodiment as shown in FIG. 5 when position correction of the glass substrate is accomplished.

FIG. 6 is a schematic view of the positioning device of the embodiment as shown in FIG. 5 during position correction of a glass substrate; FIG. 7 is a schematic view of the positioning device of the embodiment as shown in FIG. 5 after position correction of the glass substrate is accomplished. With reference to FIGS. 5-7, an operation principle of the positioning device 100 shall be described and a method for correcting position of a glass substrate by the positioning device 100 shall be explained.

As shown in FIG. 5, the glass substrate 90 is firstly placed between the positioning lever 191 and the positioning lever 192 and is intended to return to a position where its central line substantially overlaps the positioning line 91. The positioning lever 191 and the positioning lever 192 are both driven by the motor to conduct an approach movement towards the glass substrate 90 at an equal velocity. During the approach movement, since the glass substrate 90 may not be placed in a position to which it is intended to return, it is possible that the contact member(s) 110 of the positioning feet 10 (or a certain positioning foot) of a certain positioning lever contacts one side of the glass substrate 90 first; for example, as shown in FIG. 6, the positioning feet 10-1, 10-2, 10-3 and 10-4 of the positioning lever 192 contact one side of the glass substrate 90 first, and since the other side of the glass substrate 90 does not contact the positioning feet 10-1, 10-2, 10-3 and 10-4 of the positioning lever 191, the glass substrate 90 has a relatively small counterforce on the contact members 110 of the positioning feet 10, which cannot enable the elastic members 120 to produce sufficient elastic deformation, and the contact members of the positioning feet 10 are not displaced to the predetermined position, and thereby the sensor 130 cannot be triggered to be in an "ON" state; thus, the glass substrate 90 can move towards the positioning line 91 with the positioning lever 192 under the push of the position lever 192 until also the positioning feet 10-1, 10-2, 10-3 and 10-4 of the positioning lever 191 contact the other side of the glass substrate 90. As shown in FIG. 7, now as the positioning feet of the positioning levers 191 and 192 press the edges on both sides of the glass substrate 90 against each other, the glass substrate 90 has an increased counterforce on the contact members 110 of the positioning feet 10 on both sides, and the elastic members 120 are compressed. Moreover, the elastic members of the positioning feet 10 of the positioning levers 191 and 192 receive substantially the same counterforce delivered by the contact members 110, and the contact members 110 of the positioning feet 10 of the positioning levers 191 and 192 are all moved to the predetermined position correspondingly, and the sensors 130 of the positioning feet 10 of the positioning levers 191 and 192 are all triggered to be in an "ON" state, which indicates that position correction of the glass substrate 90 is accomplished. At this time, the sensors 130 of the positioning feet 10 of the positioning levers 191 and 192 which are all triggered to be in an "ON" state can feed back corresponding signals to the control member, and the control member stops the approach movement of the positioning levers 191 and 192 based on the signals fed back.

It should be understood that the positioning system 100 can achieve position correction of the glass substrate 90 placed between the positioning levers 191 and 192 despite of different situations where the glass substrate 90 is offset from the positioning line 91.

After the position correction is accomplished, the positioning levers 191 and 192 are restored to initial positions under the driving of the motor, and meanwhile, the first ends of the elastic members 120 of the positioning feet 10-1, 10-2, 10-3 and 10-4 are also restored to initial points, so are the contact members 110, preparing for the position correction processing of a next glass substrate. Therefore, this is also quite suitable for pipelined operations.

In another embodiment, one of the positioning levers 191 and 192 in the positioning device 100 can be immobilized, and only one conducts an approach movement towards the other. Specifically, a position of the immobilized positioning lever can be determined based on the position to which the glass substrate 90 is intended to return, and the glass substrate 90 is also placed between the positioning levers 191 and 192. Explanations are given by taking FIG. 5 as an example. If the positioning lever 191 is immobilized (the movement direction arrow in a dashed line indicates that the positioning lever 191 is immobilized), it is necessary to position the glass substrate 90 so that its central line substantially coincides with the positioning line 91, and the positioning lever 192 conducts an approach movement towards the glass substrate 90, and the positioning feet 10-1, 10-2, 10-3 and 10-4 of the positioning lever 192 contact a corresponding side of the glass substrate 90 first, as shown in FIG. 6, to push the glass substrate 90 to move in a direction of the other side, i.e., to correct its position towards the positioning line 91, and the positioning feet 10-1, 10-2, 10-3 and 10-4 of the positioning lever 191 will also contact a corresponding side of the glass substrate 90. As shown in FIG. 7, now as the positioning feet of the positioning levers 191 and 192 press the edges on both sides of the glass substrate 90 against each other, the glass substrate 90 has an increased counterforce on the contact member 110 of the positioning feet 10, and the elastic members 120 are compressed. Moreover, the elastic members of the positioning feet 10 of the positioning levers 191 and 192 receive substantially the same counterforce delivered by the contact members 110, and the contact members 110 of the positioning feet 10 of the positioning levers 191 and 192 are all moved to the predetermined position correspondingly, and the sensors 130 of the positioning feet 10 of the positioning levers 191 and 192 are all triggered to be in an "ON" state, which indicates that position correction of the glass substrate 90 is accomplished. At this time, the sensors 130 of the positioning feet 10 of the positioning levers 191 and 192 which are all triggered to be in an "ON" state can feed back corresponding signals to the control member, and the control member stops the approach movement of the positioning levers 191 and 192 based on the signals fed back.

Likewise, after the position correction is accomplished, the positioning lever 192 can be restored to the initial position under the driving of the motor. Meanwhile, the first ends of the elastic members 120 of the positioning feet 10-1, 10-2, 10-3 and 10-4 of the positioning levers 191 and 192 are also restored to the initial position, so are the contact members 110, preparing for the position correction processing of a next glass substrate.

Since the positioning device 100 in the above embodiments introduces the elastic member 120 and the sensor 130 to the positioning feet 10, when opposite positioning feet 10 simultaneously act on the edges on both sides of the glass substrate 90, due to the effect of interactive forces, opposite positioning feet 10 will receive substantially equal counterforces from the glass substrate 90 until the sensors of the positioning feet of the positioning lever 191 and the positioning lever 192 are all triggered to be in an "ON" state and the glass substrate 90 is corrected so that its central line substantially coincides with the positioning line 91, and thus the position correction is accomplished with accurate positioning, and specifically the offset of the glass substrate after position correction can be smaller than or equal to 2 mm; in particular, no matter how the glass substrate 90 is sized, its position can be corrected without manual switching operation of glass substrates of different sizes. The process procedure of position correction is greatly simplified, the degree of automation is improved and the workload of the operator is reduced; besides, there is no problem of manual switching operation errors, and the positioning feet and the glass substrate 90 do not contact each other mechanically and rigidly, which decreases the risks in cracking the glass substrate 90 and helps to improve the product yield, and meanwhile little damage will be done to the positioning device, which decreases the probability of multifunction of the positioning device and makes it relatively easier to ensure normal operation of the device.

The above examples mainly illustrate a positioning foot of the present disclosure, a positioning device using the positioning foot and a method for correcting position of the glass substrate. Although only some of the embodiments of the present disclosure are described, one having ordinary skills should understand that the present disclosure can be implemented in many other forms without departing from the theme and the scope thereof. Therefore, the examples and embodiments exhibited above should be regarded as exemplary instead of restrictive. The present disclosure may cover various modifications and substitutions without departing from the spirit and scope of the present disclosure defined in the appended claims.

The invention claimed is:

1. A positioning foot for correcting position of a glass substrate, comprising:
   a contact member for contacting a side of the glass substrate;
   an elastic member, a first end of which is connected with the contact member and receives a counterforce from the glass substrate delivered by the contact member so as to compress the elastic member, and a second end of which is fixed; and
   a sensor fixed on the second end of the elastic member;
   wherein, the contact member is arranged to be displaced with a compression action of the elastic member, and in response to the contact member being displaced to a predetermined position, the sensor is triggered to be in an "ON" state which causes the elastic member to stop the compression action
   wherein the sensor is a photoelectric sensor, and the positioning foot is further provided with a shutter to be displaced in synchronization with the contact member, the shutter being configured to trigger the sensor to be in an "ON" state when the contact member is displaced to the predetermined position.

2. The positioning foot according to claim 1, wherein the elastic member comprises a spring capable of being restored to its initial length after the compression action.

3. The positioning foot according to claim 1, wherein the contact member comprises:
   a roller;
   a pushing portion in fixed connection with the roller, wherein the first end of the elastic member is connected with the pushing portion; and
   wherein the shutter is fixed on the pushing portion and arranged to protrude towards the sensor.

4. The positioning foot according to claim 3, wherein the photoelectric sensor comprises an emitting portion and a receiving portion, wherein the shutter blocks signals sent by the emitting portion when it is displaced to the predetermined position.

5. The positioning foot according to claim 3, wherein the shutter is arranged to have a length in a displacement direction which is just sufficient for enabling triggering the sensor to be in an "ON" state when the contact member is displaced to the predetermined position.

6. The positioning foot according to claim 1, wherein the positioning foot is further provided with a slide rail on which the elastic member and the contact member are arranged, the contact member being displaceable in a sliding manner with the compression action of the elastic member.

7. A positioning device for correcting position of a glass substrate, comprising:
   a first positioning lever on which one or more positioning feet are fixed; and
   a second positioning lever on which one or more positioning feet are fixed;
   wherein each positioning foot on the first and second positioning levers comprises a contact member for contacting a side of the glass substrate; an elastic member, a first end of which is connected with the contact member and receives a counterforce from the glass substrate delivered by the contact member so as to compress the elastic member, and a second end of which is fixed; and a sensor fixed on the second end of the elastic member;
   wherein the contact member is arranged to be displaced with a compression action of the elastic member, and after the contact member is displaced to a predetermined position, the sensor is triggered to be in an "ON" state such that the elastic member stops the compression action; and
   wherein contact members of the positioning feet of the first positioning lever face a first side of the glass substrate, and contact members of the positioning feet of the second positioning lever face a second side of the glass substrate opposite to the first side.

8. The positioning device according to claim 7, wherein the positioning device further comprises:
   a control member for controlling both the first positioning lever and the second positioning lever to conduct an approach movement towards the glass substrate until sensors of the positioning feet of both the first positioning lever and the second positioning lever are triggered to be in an "ON" state and then stopping the approach movement of both the first positioning lever and the second positioning lever.

9. The positioning device according to claim 8, wherein the control member comprises a motor and a control unit for driving the first positioning lever and/or the second positioning lever to move;
   wherein, when triggered to be in an "ON" state, the sensor feeds back a signal to the control unit such that the motor stops driving the approach movement of the corresponding first positioning lever and/or second positioning lever.

10. The positioning device according to claim 7, wherein the first positioning lever is fixed and the second positioning lever is moveable;
    wherein the positioning device further comprises:
    a control member for controlling the second positioning lever to conduct an approach movement towards the glass substrate until the sensors of the positioning feet of both the first positioning lever and the second positioning lever are triggered to be in an "ON" state and then stopping the approach movement of the other positioning lever.

11. The positioning device according to claim 10, wherein the control member comprises a motor and a control unit for driving the first positioning lever to move;
    wherein, when triggered to be in an "ON" state, the sensor feeds back a signal to the control unit such that the motor stops driving the approach movement of the corresponding first positioning lever and/or second positioning lever.

12. The positioning device according to claim 7, wherein the first positioning lever and the second positioning lever are arranged to be parallel with a positioning line, wherein the positioning line is positioned in a position where a central line of the glass substrate shall be located after position correction.

13. The positioning device according to claim 7, wherein a plurality of said positioning feet are arranged at equal intervals in perpendicular to the first positioning lever/the second positioning lever.

14. A method for correcting position of a glass substrate, comprising the steps of:

placing the glass substrate between a first positioning lever and a second positioning lever of a positioning device;

conducting an approach movement of the first positioning lever and the second positioning lever towards each other such that the first positioning lever and the second positioning lever sequentially or simultaneously contact a first side and a second side of the glass substrate respectively;

wherein the positioning device comprises a first positioning lever on which one or more positioning feet are fixed; and a second positioning lever on which one or more positioning feet are fixed wherein each positioning foot on the first and second positioning levers comprises a contact member for contacting a side of the glass substrate; an elastic member, a first end of which is connected with the contact member and receives a counterforce from the glass substrate delivered by the contact member so as to compress the elastic member, and a second end of which is fixed; and a sensor fixed on the second end of the elastic member;

wherein the contact member is arranged to be displaced with a compression action of the elastic member, and after the contact member is displaced to a predetermined position, the sensor is triggered to be in an "ON" state such that the elastic member stops the compression action;

wherein contact members of the positioning feet of the first positioning lever face a first side of the glass substrate, and contact members of the positioning feet of the second positioning lever face a second side of the glass substrate opposite to the first side when the sensors of the positioning feet of the first positioning lever and the second positioning lever are all triggered to be in an "ON" state, which indicates that the position of the glass substrate has been corrected, stopping the approach movement.

15. The method according to claim 14, wherein when the sensors of the positioning feet of the first positioning lever and the second positioning lever are all triggered to be in an "ON" state, the sensors send a feedback signal which enables stopping the approach movement.

16. The method according to claim 14, wherein after position correction of the glass substrate is accomplished, the second positioning lever or both the first positioning lever and the second positioning lever are driven back to an initial position.

17. The method according to claim 14, wherein during the approach movement of the first positioning lever and the second positioning lever towards each other, the first positioning lever is fixed and the second positioning lever is movable, or both the first positioning lever and the second positioning lever conduct an approach movement towards the glass substrate.

18. A positioning foot for correcting position of a glass substrate, comprising:

a contact member for contacting a side of the glass substrate;

an elastic member, a first end of which is connected with the contact member and receives a counterforce from the glass substrate delivered by the contact member so as to compress the elastic member, and a second end of which is fixed; and a sensor fixed on the second end of the elastic member;

wherein, the contact member is arranged to be displaced with a compression action of the elastic member, and in response to the contact member being displaced to a predetermined position, the sensor is triggered to be in an "ON" state which causes the elastic member to stop the compression action;

wherein the sensor is a pressure sensor that receives an acting force from the elastic member generated at the second end thereof in the compression action; and wherein the contact member comprises:

a roller, and a pushing portion in fixed connection with the roller;

wherein the first end of the elastic member is connected with the pushing portion.

* * * * *